(12) United States Patent
Bang et al.

(10) Patent No.: US 8,331,175 B2
(45) Date of Patent: Dec. 11, 2012

(54) SOLID STATE DRIVE SYSTEMS AND METHODS OF REDUCING TEST TIMES OF THE SAME

(75) Inventors: Kwang-kyu Bang, Hwaseong-si (KR); Kwan-jong Park, Hwaseong-si (KR); Hyun-soo Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 336 days.

(21) Appl. No.: 12/576,543

(22) Filed: Oct. 9, 2009

(65) Prior Publication Data
US 2010/0091596 A1    Apr. 15, 2010

(30) Foreign Application Priority Data
Oct. 14, 2008 (KR) .......... 10-2008-0100740

(51) Int. Cl.
*G11C 29/00* (2006.01)
(52) U.S. Cl. ............ 365/201; 365/226; 714/36; 714/37; 714/38; 714/48
(58) Field of Classification Search .......... 365/201, 365/226; 714/36, 37, 38, 41, 42, 43, 44, 714/45, 48
See application file for complete search history.

(56) References Cited

U.S. PATENT DOCUMENTS

| | | | | |
|---|---|---|---|---|
| 5,867,719 A | * | 2/1999 | Harris et al. | 713/324 |
| 6,605,956 B2 | * | 8/2003 | Farnworth et al. | 324/750.3 |
| 6,981,179 B1 | * | 12/2005 | Shigemasa et al. | 714/36 |
| 7,053,471 B2 | | 5/2006 | Wada et al. | |
| 2008/0055991 A1 | * | 3/2008 | Kim et al. | 365/185.11 |
| 2009/0217111 A1 | * | 8/2009 | Ito | 714/718 |
| 2010/0244023 A1 | * | 9/2010 | Parkinnson | 257/48 |

FOREIGN PATENT DOCUMENTS

JP    5-302951    11/1993
JP    2002-170400    6/2002

* cited by examiner

*Primary Examiner* — Pho M Luu
*Assistant Examiner* — Thao Bui
(74) *Attorney, Agent, or Firm* — Harness, Dickey & Pierce P.L.C.

(57) ABSTRACT

According to example embodiments, a solid state drive system includes at least one semiconductor memory, a control circuit including first connection terminals, and second connection terminals. The first connection terminals may be configured to supply one or more operational voltages to the at least one semiconductor memory. The second connection terminals may be configured to supply one or more test voltages to the at least one semiconductor memory.

24 Claims, 12 Drawing Sheets

US 8,331,175 B2

SOLID STATE DRIVE SYSTEMS AND METHODS OF REDUCING TEST TIMES OF THE SAME

CROSS-REFERENCE TO RELATED APPLICATIONS

This application claims priority under 35 U.S.C. §119 to Korean Patent Application No. 10-2008-00100740 filed on Oct. 14, 2008, the contents of which are herein incorporated by reference in their entirety for all purposes.

BACKGROUND

1. Field

Example embodiments of the inventive concept are directed to solid state drive systems and methods of reducing test times of the same.

2. Description of the Related Art

A Solid State Device (SSD) is a memory data storage device that utilizes solid state memory, for example, flash-type, non-volatile memory) to store persistent data. SSDs are an alternative to conventional hard drives that have slower memory data access times due to moving parts, for example, rotating disks and/or other moving mechanical parts. The absence of moving parts in an SSD may improve electromagnetic interference (EMI), physical shock resistance, and/or reliability. However, SSDs may be more prone to electrostatic discharge (ESD) relative to a conventional servo motor found in a hard drive, where the recording surfaces may be made of a magnetic material that is more ESD-resistive. ESD may be exacerbated by higher memory densities.

SSDs may have many different structures, sizes, dimensions, volumes, interfaces, and/or compatibilities. Each set of characteristics may be referred to as a form factor. Two examples are a 1.8 inch and 2.5 inch Serial Advanced Technology Attachment (SATA)-2 standard structures. In either structure, the SSD may include one or more of the following, a printed circuit board, one or more controller integrated circuit (ICs), for example, fine-pitch ball grid array (FPBGA) controllers, one or more NAND memory ICs, one or more mobile Synchronous Dynamic Random Access Memory (SDRAM) ICs, one or more voltage detector, one or more voltage regulator, one or more heat sink, one or more diodes, one or more connectors, including input/output (I/O) pins and clock (for, example crystal) pins, and/or a case.

As a result of a plurality of hard drive specifications, many different SSDs, having different interfaces, have been developed.

SUMMARY

Example embodiments of the inventive concept are directed to solid state drive systems and methods of reducing test times of the same.

Example embodiments of the inventive concept are directed to a solid state drive system including at least one semiconductor memory, a control circuit including first connection terminals, configured to supply one or more operational voltages to the at least one semiconductor memory, and second connection terminals configured to supply one or more test voltages to the at least one semiconductor memory.

Example embodiments of the inventive concept are directed to a solid state drive system including at least one semiconductor memory, configured to store test firmware and operational data and at least one auxiliary semiconductor memory configured to store the test firmware but not operational data.

Example embodiments of the inventive concept are directed to a method of reducing test time in a solid state drive system including supplying one or more operational voltages to at least one semiconductor memory via first connection terminals and supplying one or more test voltages to the at least one semiconductor memory via second connection terminals.

Example embodiments of the inventive concept are directed to a method of reducing test time in a solid state drive system including storing test firmware and operational data in at least one semiconductor memory and store the test firmware but not operational data in at least one auxiliary semiconductor memory.

BRIEF DESCRIPTION OF THE DRAWINGS

The above and other features and advantages of example embodiments of the inventive concept will become more apparent by describing them in detailed with reference to the accompanying drawings.

DETAILED DESCRIPTION

Figure 1:
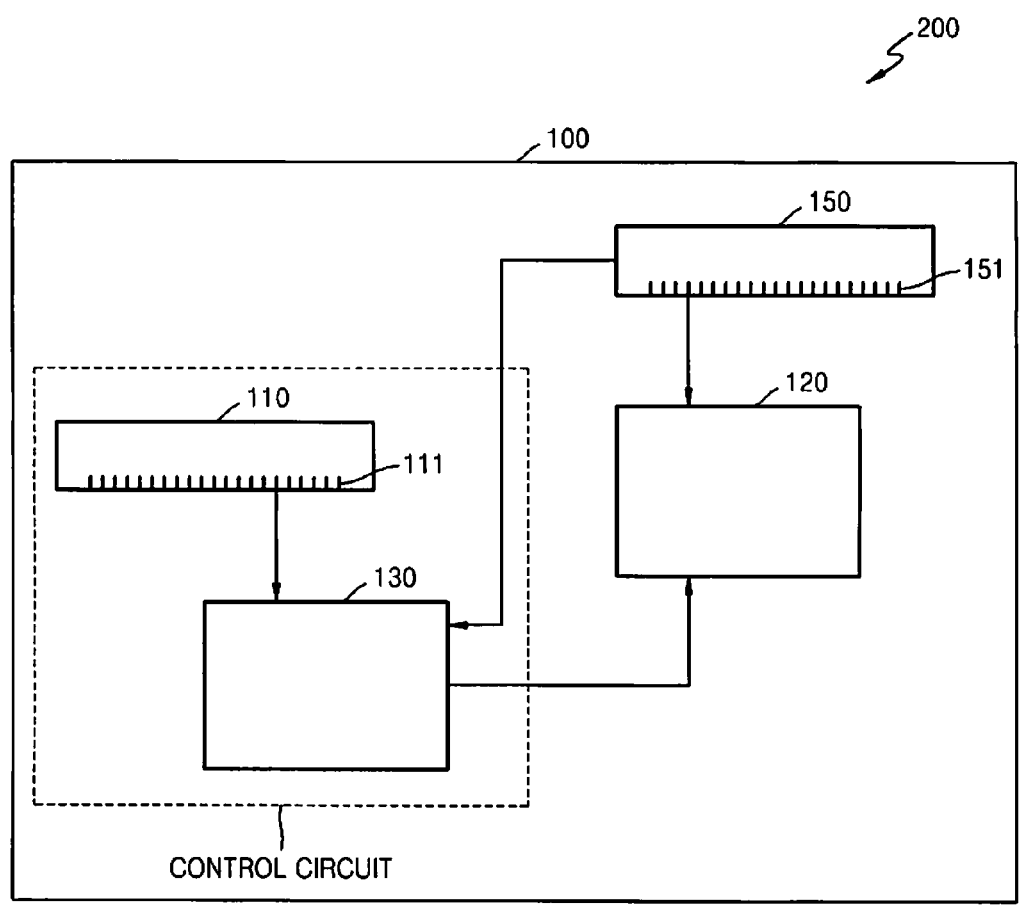
FIG. 1 illustrates a solid state drive system in accordance with example embodiments of the inventive concept.

Detailed example embodiments of the inventive concept are disclosed herein. However, specific structural and/or functional details disclosed herein are merely representative for purposes of describing example embodiments of the inventive concept. The claims may, however, may be embodied in many alternate forms and should not be construed as limited to example embodiments of the inventive concept set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section without departing from the teachings of example embodiments of the inventive concept.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments of the inventive concept and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments of the inventive concept, which are illustrated in the accompanying drawings, wherein like reference numerals refer to the like components throughout. Example embodiments of the inventive concept should not be construed as limited to the particular shapes of regions illustrated in these figures but are to include deviations in shapes that result, for example, from manufacturing.

FIG. 1 illustrates a solid state drive system 200 in accordance with example embodiments of the inventive concept. As shown in FIG. 1, a solid state drive system 200 may include at least one circuit board 100 and at least one connector 110. In example embodiments of the inventive concept, the at least one circuit board 100 may be a printed circuit board (PCB).

In example embodiments of the inventive concept, the at least one connector 110 is an electronic connector. In example embodiments of the inventive concept, the at least one connector 110 facilitates a connection with external electronic equipment. In example embodiments of the inventive concept, the at least one connector 110 is on one side or on one edge of the at least one circuit board 100. In example embodiments of the inventive concept, the at least one connector 110 includes first connection terminals 111. In example embodiments of the inventive concept, the first connection terminals 111 are on one side or on one edge of the at least one circuit board 100.

As shown in FIG. 1, the solid state drive system 200 may include another connector 150. In example embodiments of the inventive concept, the connector 150 is an electronic connector. In example embodiments of the inventive concept, the connector 150 facilitates a connection with external electronic equipment. In example embodiments of the inventive concept, the connector 150 is on one side or on one edge of the at least one circuit board 100. In example embodiments of the inventive concept, the connector 150 includes second connection terminals 151. In example embodiments of the inventive concept, the second connection terminals 151 are on one side or on one edge of the at least one circuit board 100.

As shown in FIG. 1, the solid state drive system 200 may further include other electronic components, for example, at least one semiconductor memory 120 and/or at least one memory controller 130. These electronic components may be provided in any number and connected in any manner and in any configuration. The configuration in FIG. 1 is an example.

In example embodiments of the inventive concept, the at least one memory controller 130 and the at least one connector 110 may constitute a control circuit.

The at least one circuit board 100 may include the necessary printed circuit patterns to form suitable electrical connection between the electronic components 120, 130 and the connectors 110, 150. In example embodiments of the inventive concept, the at least one semiconductor memory 120 is a NAND flash, a phase change random access memory (PRAM), a magnetic random access memory (MRAM), a ferromagnetic random access memory (FRAM), or a resistive random access memory (RRAM).

In example embodiments of the inventive concept, each of the at least one semiconductor memories 120 may be a semiconductor package or a semiconductor chip, which may include a bump-type connection. In example embodiments of the inventive concept, each of the at least one semiconductor memories 120 may be attached on a top of the at least one circuit board 100 or a bottom of the at least one circuit board 100.

The at least one semiconductor memory 120 and the at least one circuit board 100 may be connected by any combination of wires, pads, balls, bumps, patterns and/or other elements to make an electrical connection between the at least one semiconductor memory 120 and the at least one circuit board 100.

In example embodiments of the inventive concept, the at least one connector 110 and the first connection terminals 111 are configured to supply one or more operational voltages to the at least one semiconductor memory 120 and the connector 150 and the second connection terminals 151 are configured to supply one or more test voltages to the at least one semiconductor memory 120.

Due to restrictions on a supply voltage provided from a tester, when solid state drive systems, such as solid state drive system 200, are tested, one or two blocks of memory from the at least one semiconductor memory 120 may be read or written. In example embodiments of the inventive concept, the connector 150 may act as external power connection terminals and facilitate the supply of an external voltage. In example embodiments of the inventive concept, the external voltage may be used to test the at least one semiconductor memory 120 and may be larger than a normal external voltage supplied from the tester.

Consequently, when performing a read/write of a unit of above two blocks of the at least one semiconductor memory 120, an instantaneous "current drop" may be avoided.

Additionally, the larger external voltage may be used to simultaneously write/read more memory blocks. Consequently, a writing/reading testing time may be reduced.

In example embodiments of the inventive concept, the larger external voltage may be by a supplier, for example, for the purpose of electric function testing and is not used by a user of the solid state drive system 200. In example embodiments of the inventive concept, the connector 150 may be located on a neck of the at least one circuit board 100. In example embodiments of the inventive concept, the connector 150 may be a hall form (or hole type) connector, a pin form connector, or a (Super plastic Metal Alloy) SMA form connector.

In example embodiments of the inventive concept, the one or more operational voltages supplied to the at least one semiconductor memory 120 from the at least one connector 110 and the first connection terminals 151 may pass through a voltage regulator. In example embodiments of the inventive concept, the one or more test voltages supplied to the at least one semiconductor memory 120 from the connector 150 and the second connection terminals 151 do not pass through a voltage regulator.

In example embodiments of the inventive concept, the one or more test voltages supplied to the at least one semiconductor memory 120 from the connector 150 and the second connection terminals 151 are larger than the one or more operational voltages supplied to the at least one semiconductor memory 120 from the at least one connector 110 and the first connection terminals 151.

In example embodiments of the inventive concept, the one or more test voltages supplied to the at least one semiconductor memory 120 from the connector 150 and the second connection terminals 151 are supplied to the at least one semiconductor memory 120 without a voltage drop.

In example embodiments of the inventive concept, the one or more test voltages supplied to the at least one semiconductor memory 120 from the connector 150 and the second connection terminals 151 are used to activate a multi-block test function of the at least one semiconductor memory 120.

In example embodiments of the inventive concept, the one or more test voltages supplied to the at least one semiconductor memory 120 from the connector 150 and the second connection terminals 151 are boosted by a boosting function of the at least one semiconductor memory 120.

Figure 2:
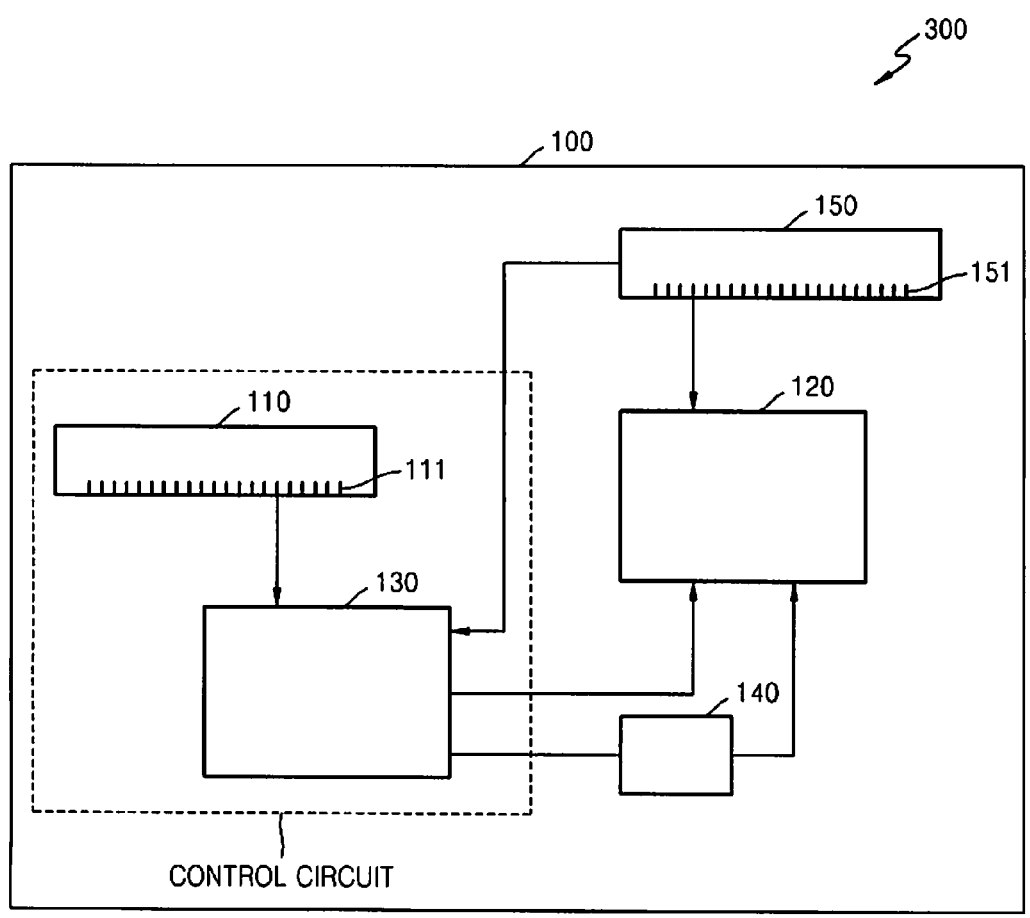
FIG. 2 illustrates a solid state drive system in accordance with example embodiments of the inventive concept.

FIG. 2 illustrates a solid state drive system 300 in accordance with example embodiments of the inventive concept. The solid state drive system 300 of FIG. 2 is similar to the solid state drive system 200 of FIG. 1, except for the addition of at least one voltage regulator 140. In example embodiments of the inventive concept, the at least one voltage regulator 140 is configured to regulate the one or more operational voltages supplied to the at least one semiconductor memory 120 from the at least one connector 110 and the first connection terminals 151 and supply the one or more regulated operational voltages to the at least one semiconductor memory 120. In example embodiments of the inventive concept, the at least one voltage regulator 140 is a buffer memory.

Compared to other storage media, for example, secure digital (SD) cards, USB memory etc, solid state drive systems such as solid state drive system 300 may control and store more data. A difference between the speed of the at least one semiconductor memory 120 and the at least one memory controller 130 may cause a data processing delay. In example embodiments of the inventive concept, the at least one voltage regulator 140 may be provided to act as a buffer between the at least one semiconductor memory 120 and the at least one memory controller 130.

Figure 3A:
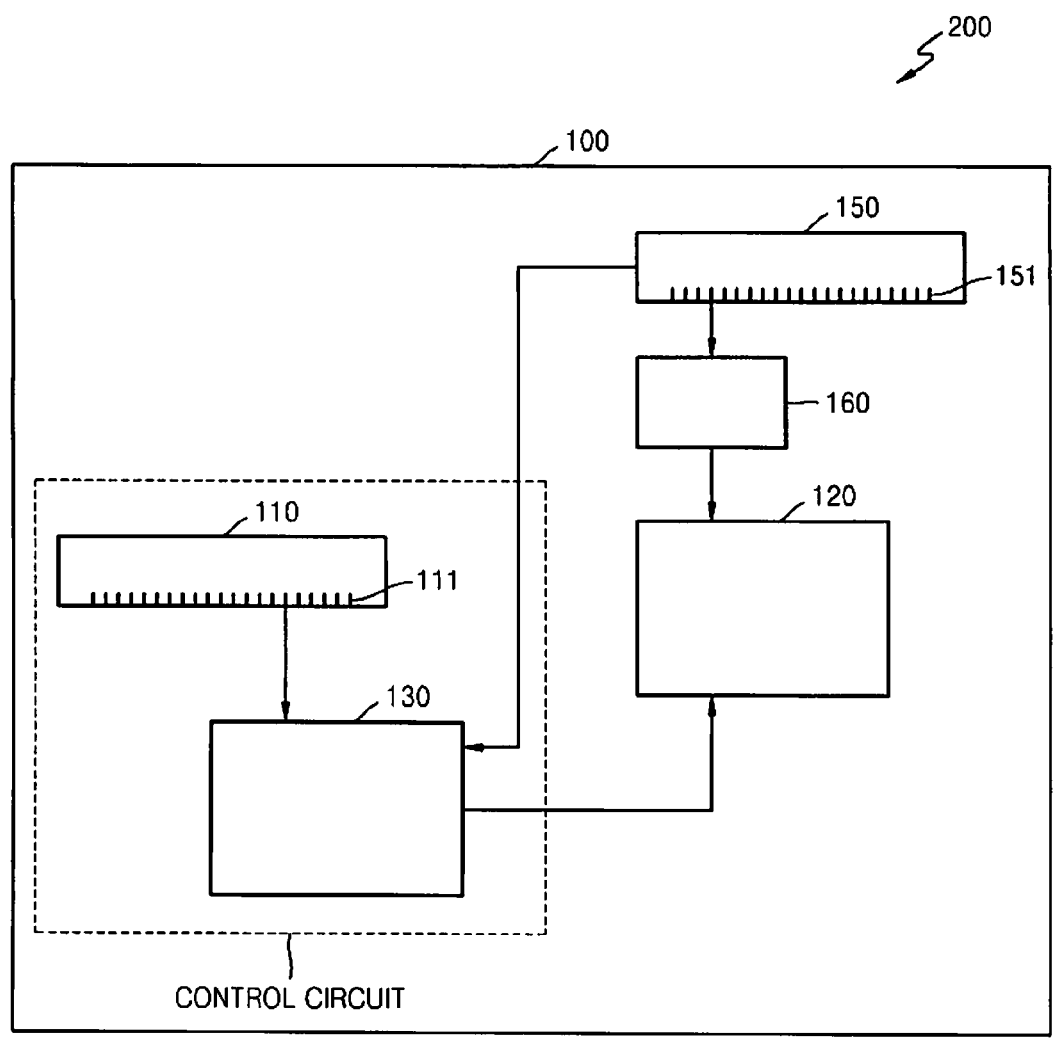
FIG. 3A illustrates a solid state drive system in accordance with example embodiments of the inventive concept.

FIG. 3 illustrates a solid state drive system 400 in accordance with example embodiments of the inventive concept. The solid state drive system 400 of FIG. 3 is similar to the solid state drive system 200 of FIG. 1, except for the addition of at least one switch 160.

In example embodiments of the inventive concept, the at least one switch 160 is operationally connected to the second connection terminals 151 to supply the one or more test voltages to the at least one semiconductor memory 120. In example embodiments of the inventive concept, the at least one switch 160 includes a plurality of transistors, one for each of the at least one solid state memories 120. In example embodiments of the inventive concept, the at least one memory controller acts as the at least one switch 160.

In example embodiments of the inventive concept, the at least one switch 160 and the at least one memory controller 130 controls the connector 150 to selectively to supply voltages to the at least one semiconductor memory 120.

Through the connector 150, an external voltage may be supplied to the solid state drive system 400 which may operate firmware from a tester (not shown). After the test firmware operates through the at least one switch 160 and the at least one memory controller 130, the voltage which is supplied from the tester is not supplied to the at least one semiconductor memory 120. An external voltage from the connector 150 may be supplied to the at least one semiconductor memory 120 and operate the at least one semiconductor memory 120, which may include, for example, eight (8) NAND flash memories.

Through the connector 150, because the rated voltage which may be delivered to the at least one semiconductor memory 120 is larger than the rated voltage delivered from the tester, it is possible to select multiple blocks, for example, more than four blocks and to test read/write simultaneously.

Figure 3B:
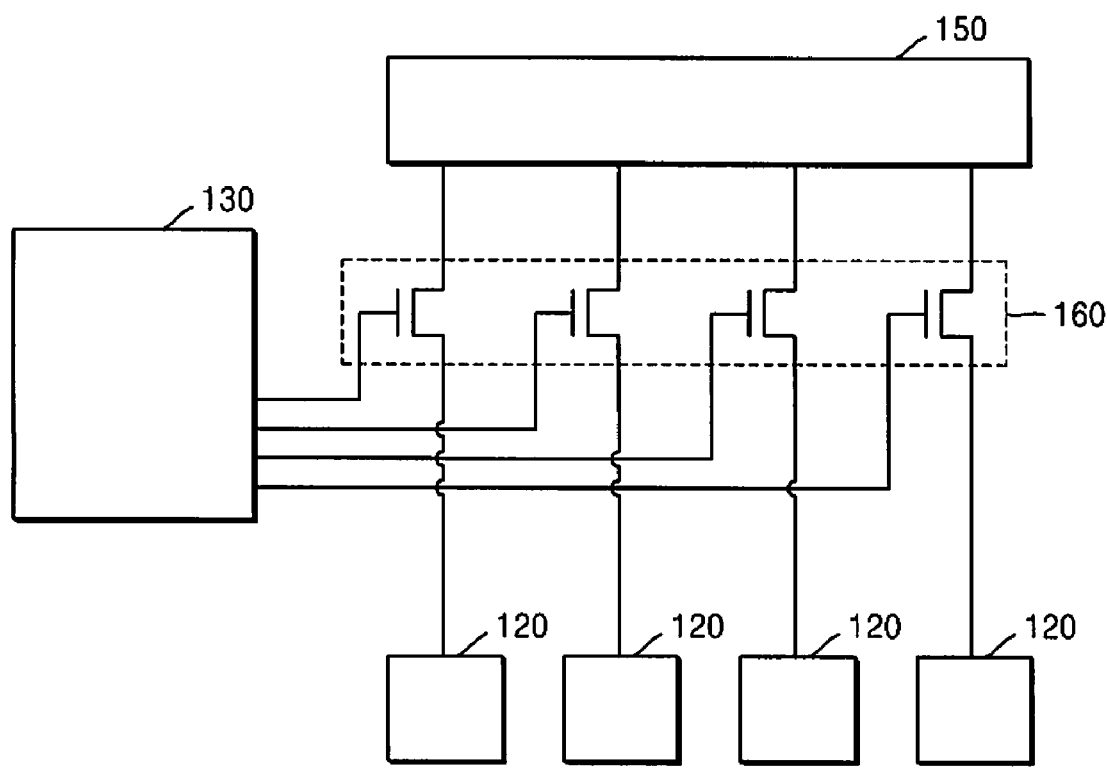
FIG. 3B illustrates an implementation of the at least one switch, the connector, and the at least one memory controller in accordance with example embodiments of the inventive concept.

FIG. 3B illustrates an implementation of the at least one switch 160, the connector 150, and the at least one memory controller 130, in example embodiments of the inventive concept. As shown, the at least one switch 160 may include a plurality of transistors, one for each of the at least one solid state memories 120.

In example embodiments of the inventive concept, the at least one switch 160 provides a different test voltage to each of the at least one solid state memories 120.

Figure 4:
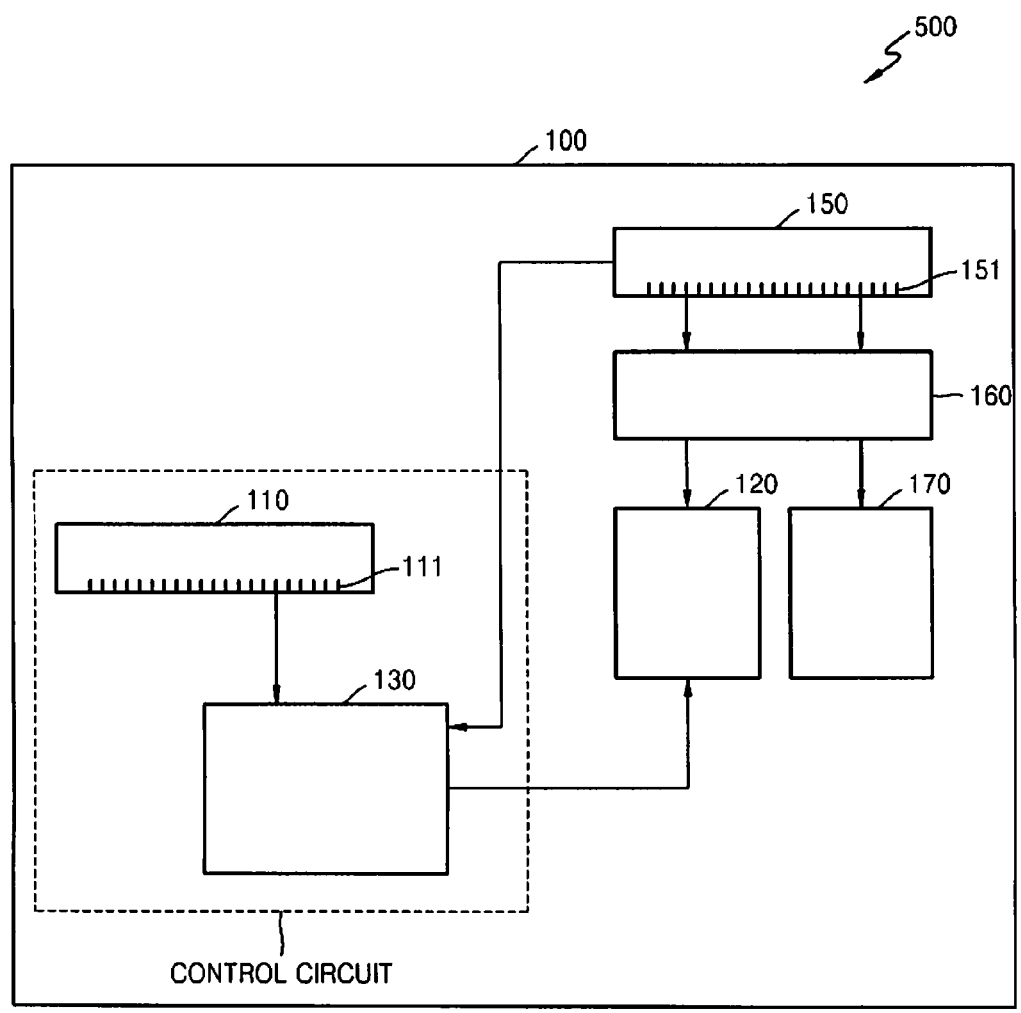
FIG. 4 illustrates a solid state drive system in accordance with example embodiments of the inventive concept.

FIG. 4 illustrates a solid state drive system 500 in accordance with example embodiments of the inventive concept. The solid state drive system 500 of FIG. 4 is similar to the solid state drive system 400 of FIG. 3, except for the addition of at least one at least one auxiliary solid state memory 170.

In example embodiments of the inventive concept, the at least one auxiliary solid state memory 170 is one of the at least one solid state memories 120. In example embodiments of the inventive concept, the at least one auxiliary solid state memory 170 is configured to store test firmware, but not operational data. In example embodiments of the inventive concept, the test firmware is program information to control one or more other components of the solid state memory 500.

In example embodiments of the inventive concept, the at least one auxiliary solid state memory 170 is different from the at least one semiconductor memory 120. In example embodiments of the inventive concept, the at least one auxiliary solid state memory 170 is one of a PRAM, MRAM, FRAM, and RRAM. In example embodiments of the inventive concept, the at least one semiconductor memory 120 is a different one of a PRAM, MRAM, FRAM, and RRAM.

In example embodiments of the inventive concept, the at least one auxiliary solid state memory 170 is a static random access memory (SRAM) embedded in a controller, for example, the at least one memory controller 130.

In example embodiments of the inventive concept, the at least one auxiliary solid state memory 170 may be provided in a different area of the at least one circuit board 100.

In example embodiments of the inventive concept, the at least one auxiliary solid state memory 170 may be a NAND flash memory. In example embodiments of the inventive concept, the test firmware may be loaded normally from the tester and be used to store a program into the at least one semiconductor memory 120. In example embodiments of the inventive concept, the at least one memory controller 130 may execute electric function tests on the solid state drive system 500.

In example embodiments of the inventive concept, the at least one auxiliary solid state memory 170 is provided. The firmware provide by the tester may be loaded into the at least one auxiliary solid state memory 170, instead of the at least one semiconductor memory 120.

In example embodiments of the inventive concept, the test firmware is written into the at least one semiconductor memory, the testing is performed, and the test firmware is deleted from the at least one semiconductor memory. In example embodiments of the inventive concept, the test firmware is stored in the at least one auxiliary solid state memory as a backup.

The at least one auxiliary solid state memory 170 is not used for performing write/read testing to verify reliability, as a result, the at least one auxiliary solid state memory 170 is not subject to the same stresses as the at least one semiconductor memory 120. If the test firmware is loaded into the at least one auxiliary solid state memory 170, rather than the at least one semiconductor memory 120, the at least one memory controller 130 should have no problem retrieving the test firmware from the at least one auxiliary solid state memory 170, which may occur if the at least one memory controller 130 tries to retrieve the test firmware from the at least one semiconductor memory 120.

Figure 5:
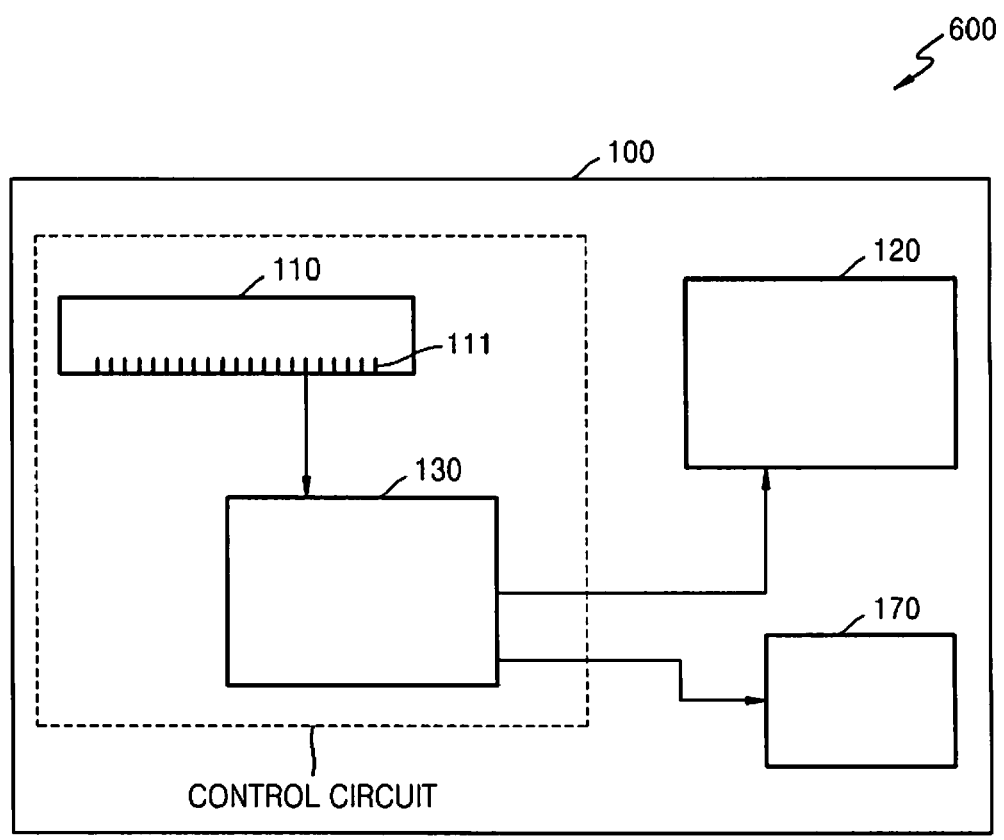
FIG. 5 illustrates a solid state drive system in accordance with example embodiments of the inventive concept.

FIG. 5 illustrates a solid state drive system 600 in accordance with example embodiments of the inventive concept. The solid state drive system 600 of FIG. 5 is similar to the solid state drive system 500 of FIG. 4, except for the omission of the connector 150.

Any or all of the features discussed above with respect to FIGS. 1-5 may be used alone or in any combination, for example, the at least one voltage regulator 140, the connector 150, the at least one switch 160, and the at least one auxiliary solid state memory 170 may be provided in any number and connected in any manner and in any configuration.

In example embodiments of the inventive concept, the test firmware is written into the at least one semiconductor memory, the testing is performed, and the test firmware is deleted from the at least one semiconductor memory. In example embodiments of the inventive concept, the test firmware is stored in the at least one auxiliary solid state memory as a backup.

Figure 6:
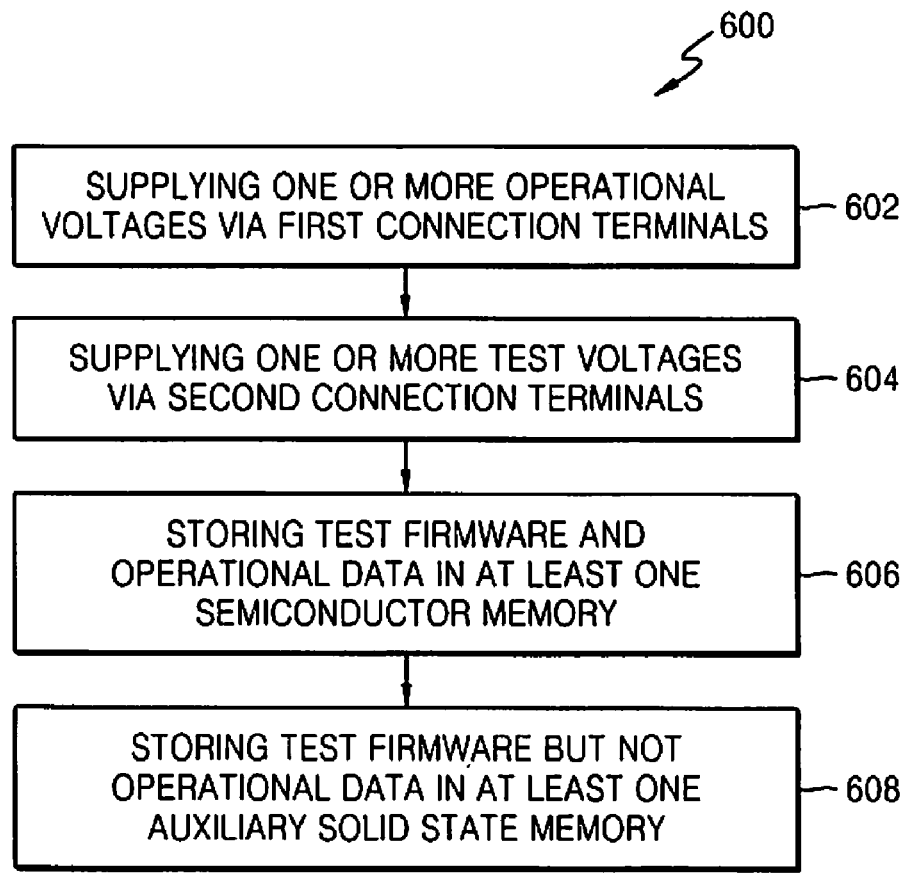
FIG. 6 illustrates a method of reducing test time in a solid state drive system in accordance with example embodiments of the inventive concept.

FIG. 6 illustrates a method 600 of reducing test time in a solid state drive system in accordance with example embodiments of the inventive concept. In example embodiments of the inventive concept, the method of reducing test time in a solid state drive system may include operation 602 including supplying one or more operational voltages to at least one semiconductor memory 120 via first connection terminals 111 and operation 604 including supplying one or more test voltages to the at least one semiconductor memory 120 via second connection terminals 151.

As shown in FIG. 4, the one or more test voltages may be supplied to the at least one semiconductor memory 120 via the second connection terminals 151 and the at least one switch 160.

In example embodiments of the inventive concept, for example, as shown in FIGS. 4 and 5, the method 600 of reducing test time in a solid state drive system may further include operation 606 including storing test firmware and operational data in the at least one semiconductor memory 120 and operation 608 including storing test firmware but not operational data in at least one auxiliary solid state memory 170.

Figure 7:
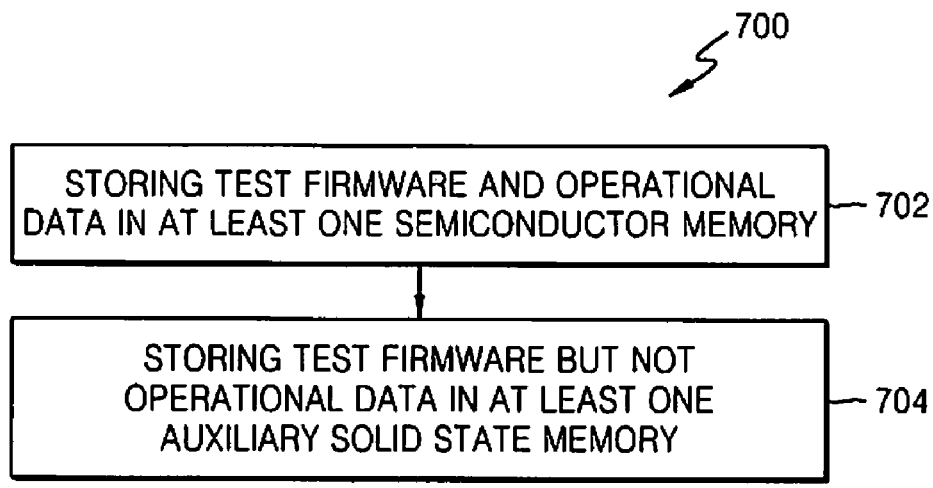
FIG. 7 illustrates a method of reducing test time in a solid state drive system in accordance with example embodiments of the inventive concept.

FIG. 7 illustrates a method 700 of reducing test time in a solid state drive system in accordance with example embodiments of the inventive concept. In example embodiments of the inventive concept, the method 700 of reducing test time in a solid state drive system may include operation 702 including storing test firmware and operational data in at least one semiconductor memory 120 and operation 704 including storing the test firmware but not operational data in at least one auxiliary solid state memory 170.

In example embodiments of the inventive concept, the at least one auxiliary solid state memory 170 is different from the at least one semiconductor memory 120. In example embodiments of the inventive concept, the at least one auxiliary solid state memory 170 is one of a PRAM, MRAM, FRAM, and RRAM. In example embodiments of the inventive concept, the at least one semiconductor memory 120 is a different one of a PRAM, MRAM, FRAM, and RRAM.

In example embodiments of the inventive concept, the at least one auxiliary solid state memory 170 is a static random access memory (SRAM) embedded in a controller, for example, the at least one memory controller 130.

In example embodiments of the inventive concept, the firmware is loaded normally from the tester and a program is stored record in the at least one semiconductor memory 120. In example embodiments of the inventive concept, the at least one memory controller 130 then executes an electric function test.

Figure 8:
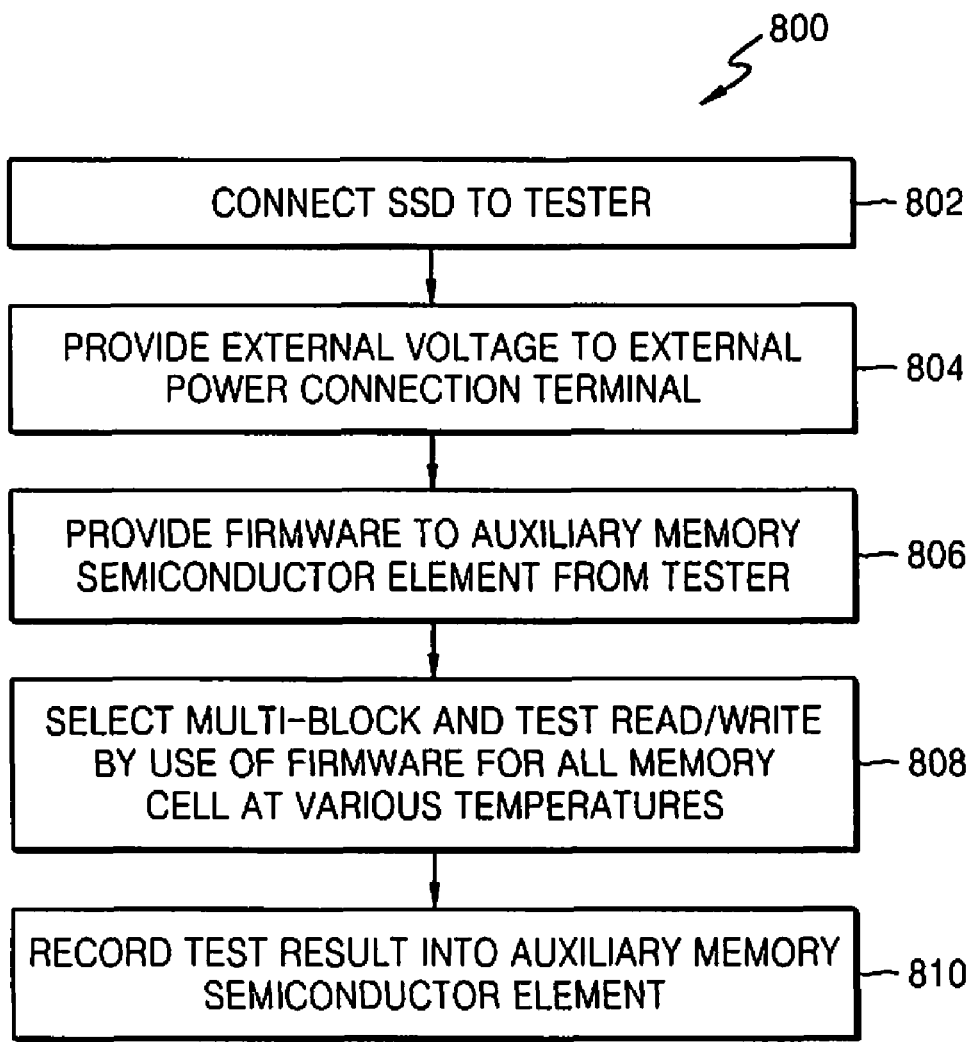
FIG. 8 illustrates a method of reducing test time in a solid state drive system in accordance with example embodiments of the inventive concept.

FIG. 8 illustrates a method 800 of reducing test time in a solid state drive system in accordance with example embodiments of the inventive concept. In example embodiments of the inventive concept, the method of reducing test time in a solid state drive system may include operation 802 including connecting a solid state drive system 200, 300, 400, 500, 600 to a tester via a connector 150. In example embodiments of the inventive concept, the tester can read and write a data in the solid state drive system 200, 300, 400, 500, 600.

In example embodiments of the inventive concept, the method 800 of reducing test time in a solid state drive system may include operation 804 including providing an external voltage to an external connection terminal, for example, connector 150. If an external voltage larger than a rated consuming voltage is supplied from the tester to the solid state drive system 200, 300, 400, 500, 600, when reading and writing data in too many memories spaces, for example, greater than four (4) blocks of a NAND flash, a current drop does not occur.

In example embodiments of the inventive concept, the method 800 of reducing test time in a solid state drive system may include operation 806 providing test firmware to a firmware memory semiconductor element, for example, the at least one auxiliary solid state memory 170, from the tester.

In example embodiments of the inventive concept, the method 800 of reducing test time in a solid state drive system may include operation 808 including selecting multi-blocks and test read/write by use of test firmware for all memory cells, for example, all of at least one semiconductor memories 120, at various temperatures.

In example embodiments of the inventive concept, the results may be stored in the at least one auxiliary solid state memory 170.

In example embodiments of the inventive concept, the use of the at least one switch 160 which is loaded in the solid state drive system 200, 300, 400, 500, 600 may be used to supply the voltage to the at least one semiconductor memory 120. In example embodiments of the inventive concept, all cells of the at least one semiconductor memory 120 may be read/write tested.

In example embodiments of the inventive concept, the temperature condition under which each read/write test was performed may be a normal temperature at which a system 200, 300, 400, 500, 600, for example, a personal computer in which the solid state memory system 200, 300, 400, 500, 600 is provided, for example, 35° C. or a high temperature, for example, 75 to 125° C. or a lower temperature, for example, 0 to −40° C. which are more severe temperature conditions.

In example embodiments of the inventive concept, a solid state drive system includes at least two connectors.

In example embodiments of the inventive concept, one of the connectors may supply one or more operational voltages. In example embodiments of the inventive concept, the other connector may supply one or more test voltages.

In example embodiments of the inventive concept, the one or more test voltages are larger than the one or more operational voltages. In example embodiments of the inventive concept, the larger voltages may be used to test more memories of the solid state drive system simultaneously and/or more blocks of the same memory of the solid state drive system simultaneously.

In example embodiments of the inventive concept, the larger voltages may prevent an instantaneous current drop that may occur when attempting to read/write to more memories of the solid state drive system simultaneously. In example embodiments of the inventive concept, the larger voltages may permit activation of a multi-block test function, where more blocks of the same memory of the solid state drive system may be read/written simultaneously.

In example embodiments of the inventive concept, the larger voltages may be used for testing and not during operation by a user.

In example embodiments of the inventive concept, one or more operational voltages may pass through a voltage regulator. In example embodiments of the inventive concept, the voltage regulator is a buffer memory. In example embodiments of the inventive concept, the voltage regulator may act as a buffer to compensate for different processing speeds among the solid state drive system and other memory systems.

In example embodiments of the inventive concept, the one or more test voltages do not pass through a voltage regulator.

In example embodiments of the inventive concept, the one or more test voltages may pass through a switch or plurality of switches. In example embodiments of the inventive concept, the switch or plurality of switches is a transistor or a plurality of transistors. In example embodiments of the inventive concept, the at least one memory controller acts as the switch.

In example embodiments of the inventive concept, the one or more test voltages and switch or plurality of switches may be used to supply firmware from a tester to the solid state drive system.

In example embodiments of the inventive concept, the solid state drive system may include at least one auxiliary solid state memory. In example embodiments of the inventive concept, the at least one auxiliary solid state memory is configured to store test firmware, but not operational data. In example embodiments of the inventive concept, the at least one auxiliary solid state memory is part of at least one semiconductor memory. In example embodiments of the inventive concept, the test firmware is written into the at least one semiconductor memory, the testing is performed, and the test firmware is deleted from the at least one semiconductor memory. In example embodiments of the inventive concept, the test firmware is stored in the at least one auxiliary solid state memory as a backup.

In example embodiments of the inventive concept, test firmware may be loaded from a tester and be used to store a program into the at least one semiconductor memory. In example embodiments of the inventive concept, at least one controller may execute electric function tests on the solid state drive system.

In example embodiments of the inventive concept, the at least one auxiliary solid state memory is a separate memory. Firmware provide by the tester may be loaded into the at least one auxiliary solid state memory, instead of the at least one solid state memory.

In example embodiments of the inventive concept, the test firmware is written into the at least one semiconductor memory, the testing is performed, and the test firmware is deleted from the at least one semiconductor memory. In example embodiments of the inventive concept, the test firmware is stored in the at least one auxiliary solid state memory as a backup.

In example embodiments of the inventive concept, the at least one auxiliary solid state memory is not used for performing write/read testing to verify reliability, as a result, the at least one auxiliary solid state memory is not subject to the same stresses as the at least one solid state memory. If the test firmware is loaded into the at least one auxiliary solid state memory, rather than the at least one solid state memory, the at least one controller should have no problem retrieving the test firmware from the at least one auxiliary solid state memory, which may occur if the at least one controller tries to retrieve the test firmware from the at least one solid state memory.

In example embodiments of the inventive concept, testing is performed on the at least one semiconductor memory and the results may be stored in the at least one auxiliary solid state memory.

Figure 9:
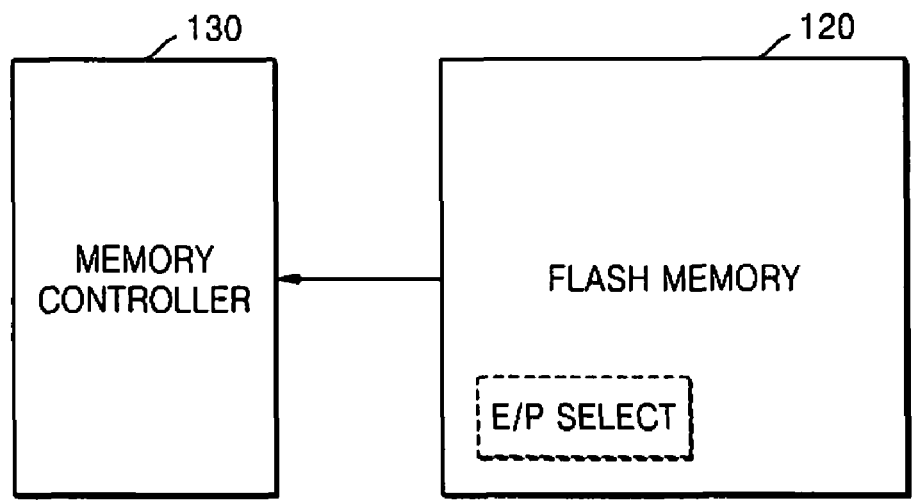
FIG. 9 illustrates an example embodiment including a memory controller in accordance with example embodiments of the inventive concept.

FIG. 9 illustrates an example embodiment including a memory controller in accordance with example embodiments of the inventive concept. As shown, FIG. 9 includes at least one semiconductor memory 120 connected to at least one memory controller 130. The at least one semiconductor memory 120 may be a NAND flash memory or NOR flash memory. However, the at least one semiconductor memory 120 is not limited to these memory types, and may be any memory type.

The at least one memory controller 130 may supply the input signals for controlling operation of the at least one semiconductor memory 120. For example, in the case of a NAND flash memory, the at least one memory controller 130 may supply the command CMD and address signals. In examples of a NOR flash memory, the at least one memory controller 130 may supply CMD, ADD, DQ and VPP signals. It will be appreciated that the at least one memory controller 130 may control the at least one semiconductor memory 120 based on received control signals (not shown).

Figure 10:
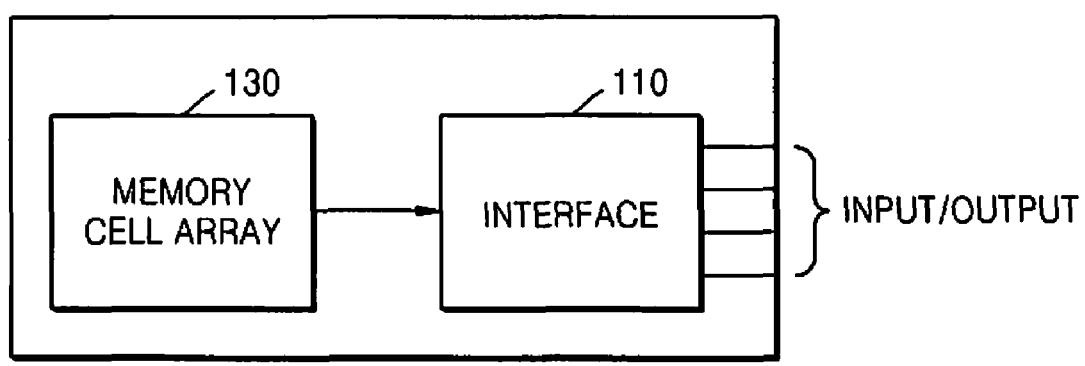
FIG. 10 illustrates another example embodiment including an interface in accordance with example embodiments of the inventive concept.

FIG. 10 illustrates another example embodiment including an interface in accordance with example embodiments of the inventive concept. As shown, FIG. 10 includes at least one semiconductor memory 120 connected to an interface 515, which may be part of the at least one connector 110. The at least one semiconductor memory 120 may be a NAND flash memory or a NOR flash memory. However, the at least one semiconductor memory 120 is not limited to these memory types, and may be any memory type.

The interface 515 may supply the input signals (for example, generated externally) for controlling operation of the at least one semiconductor memory 120. For example, in the case of a NAND flash memory, the interface 515 may supply the command CMD and address signals. In the example of a NOR flash memory, the interface 515 may supply CMD, ADD, DQ and VPP signals. It will be appreciated that the interface 515 may control the at least one semiconductor memory 120 based on received control signals (for example, generated externally, but not shown).

Figure 11:
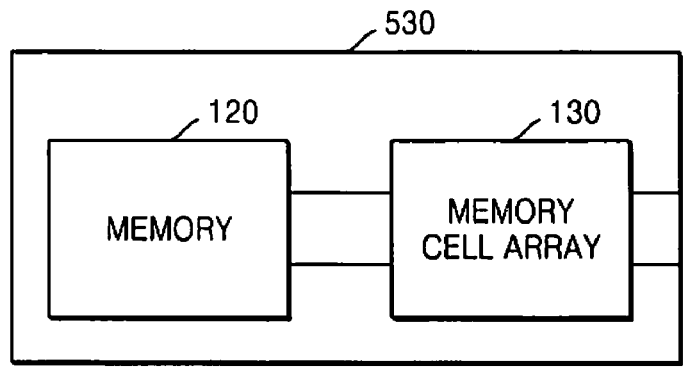
FIG. 11 illustrates an example memory card in accordance with example embodiments of the inventive concept.

FIG. 11 illustrates an example memory card in accordance with example embodiments of the inventive concept. FIG. 11 is similar to FIG. 9, except that the at least one semiconductor memory 120 and at least one memory controller 130 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the at least one memory controller 130 may control the at least one semiconductor memory 120 based on controls signals received by the card 530 from another (e.g., external) device.

Figure 12:
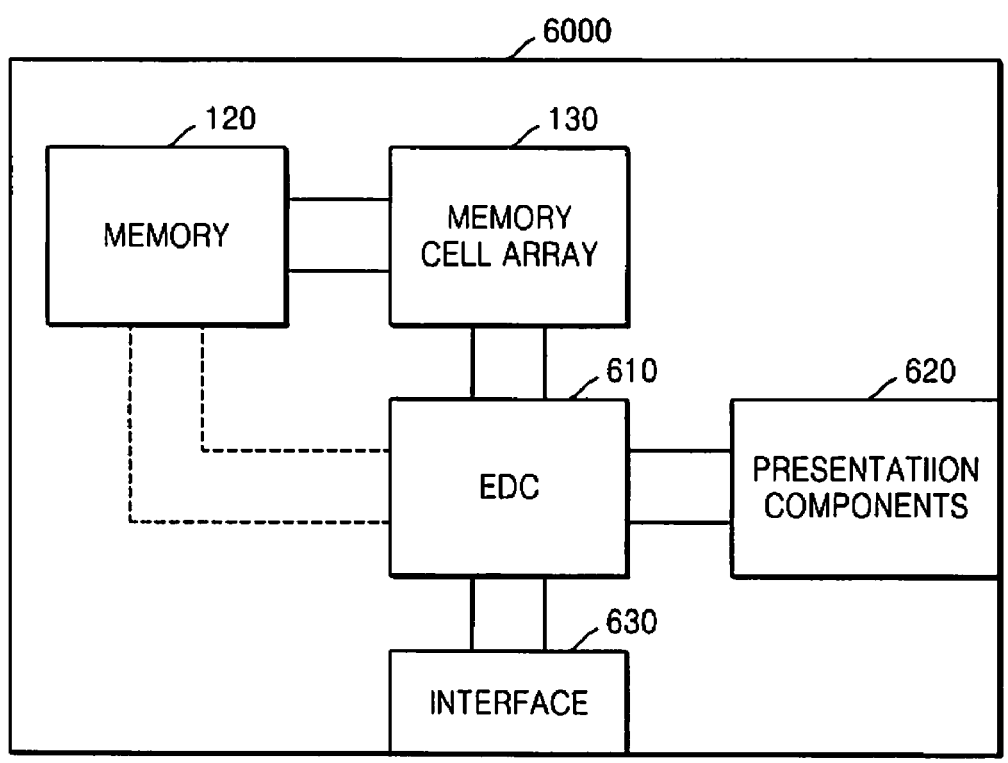
FIG. 12 illustrates an example portable device in accordance with example embodiments of the inventive concept.

FIG. 12 illustrates an example portable device in accordance with example embodiments of the inventive concept. FIG. 12 represents a portable device 6000. The portable device 6000 may be an MP3 player, video player, combination video and audio player, etc. As shown, the portable device 6000 includes the at least one semiconductor memory 120 and at least one memory controller 130. The portable device 6000 may also includes an encoder and decoder 610, presentation components 620 and interface 630, which may be part of the at least one connector 110.

Data (video, audio, etc.) may be input to and output from the at least one semiconductor memory 120 via the at least one memory controller 130 by an encoder and decoder (EDC) 610. As shown by the dashed lines in FIG. 12, the data may be directly input to the at least one semiconductor memory 120 from the EDC 610 and/or directly output from the at least one semiconductor memory 120 to the EDC 610.

The EDC 610 may encode data for storage in the at least one semiconductor memory 120. For example, the EDC 610 may perform MP3 encoding on audio data for storage in the at least one semiconductor memory 120. Alternatively, the EDC 610 may perform MPEG encoding (e.g., MPEG2, MPEG4, etc.) on video data for storage in the at least one semiconductor memory 120. Still further, the EDC 610 may include multiple encoders for encoding different types of data according to different data formats. For example, the EDC 610 may include an MP3 encoder for audio data and an MPEG encoder for video data.

The EDC 610 may decode output from the at least one semiconductor memory 120. For example, the EDC 610 may perform MP3 decoding on audio data output from the at least one semiconductor memory 120. Alternatively, the EDC 610 may perform MPEG decoding (e.g., MPEG2, MPEG4, etc.) on video data output from the at least one semiconductor memory 120. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include decoders. For example, already encoded data may be received by the EDC 610 and passed to the at least one memory controller 130 and/or the at least one semiconductor memory 120.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the at least one semiconductor memory 120 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 13:
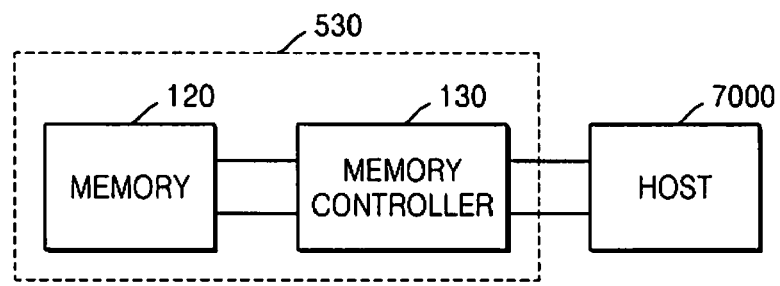
FIG. 13 illustrates an example memory card and host system in accordance with example embodiments of the inventive concept.

FIG. 13 illustrates an example memory card and host system in accordance with example embodiments of the inventive concept in which the host system 7000 is connected to the card 530 of FIG. 11. In example embodiments of the inventive concept, the host system 7000 may apply control signals to the card 530 such that the at least one memory controller 130 controls operation of the at least one semiconductor memory 120.

Figure 14:
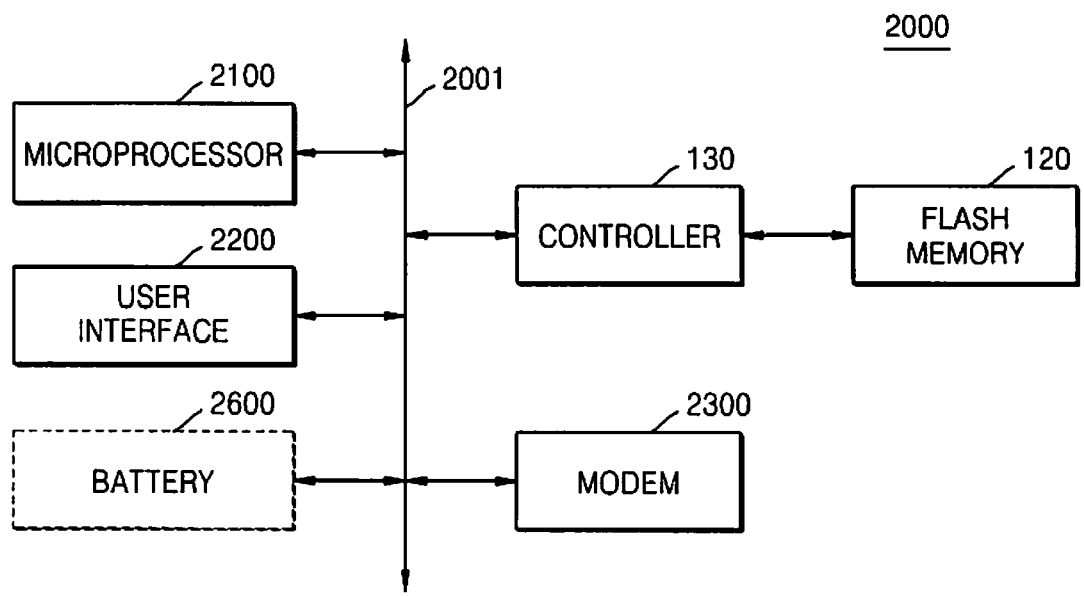
FIG. 14 illustrates an example system in accordance with example embodiments of the inventive concept.

FIG. 14 illustrates an example system in accordance with example embodiments of the inventive concept. As shown, system 2000 may include a microprocessor 2100, user interface 2200, for example, a keypad, a keyboard, and/or a display, modem 2300, at least one memory controller 130, at least one semiconductor memory 120 and/or battery 2600. In example embodiments of the inventive concept, each of the system elements may be combined each other through a bus 2001.

The at least one memory controller 130 may also include one or more microprocessors, a digital signal processor, a microcontroller, or any processor similar to the above. The at least one semiconductor memory 120 may be used to store data and/or commands executed by the at least one memory controller 130. The at least one semiconductor memory 120 may be any of any of the memories described in example embodiments of the inventive concept above.

The modem 2300 may be used to transmit data to and/or from another system, for example, a communication network. The system 2000 may be part of a mobile system, such as a PDA, a portable computer, web tablet, a wireless phone, a mobile phone, a digital music player, memory card, or other system transmitting and/or receiving information.

Figure 15:
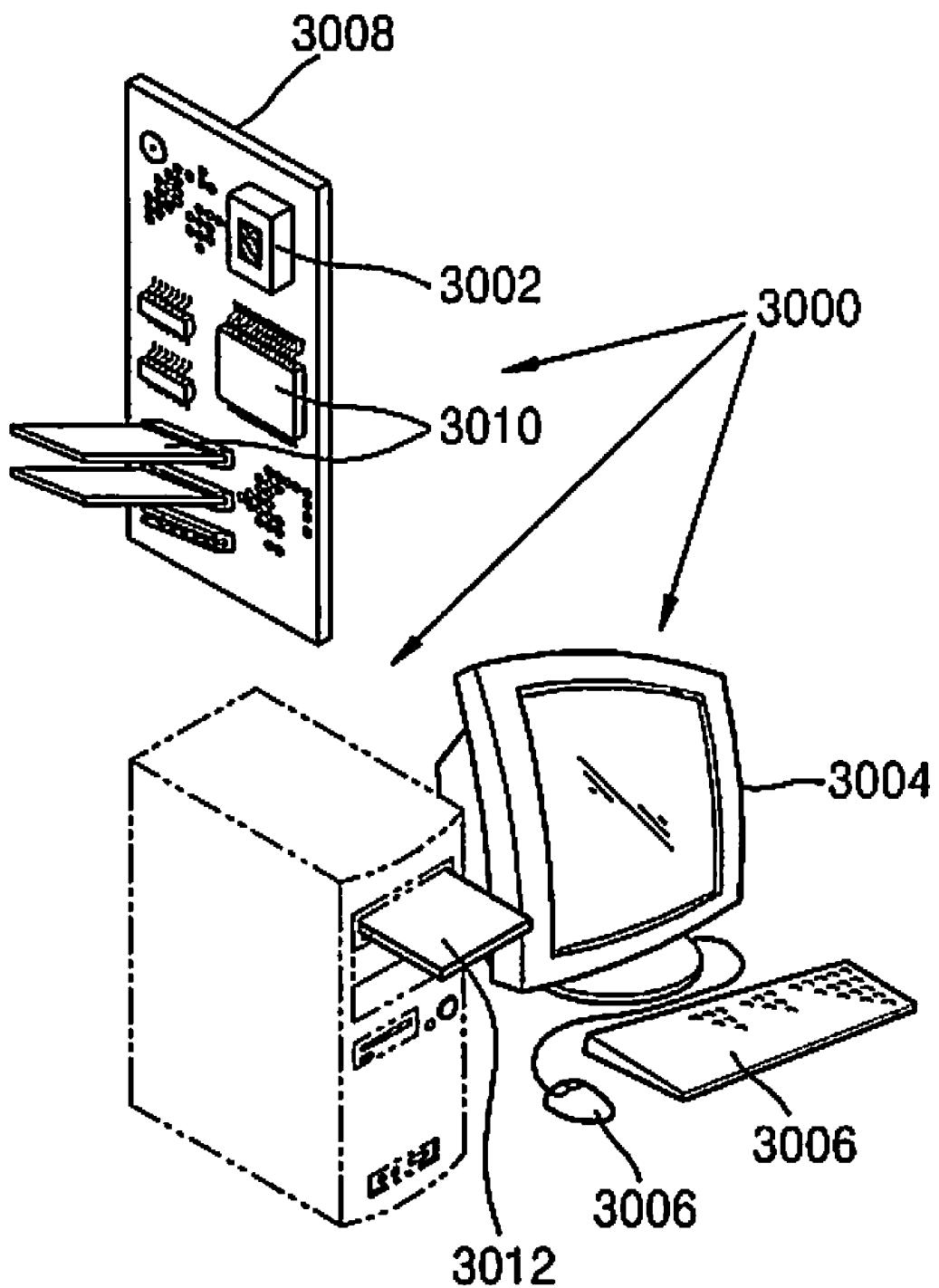
FIG. 15 illustrates an example computer system in accordance with example embodiments of the inventive concept.

FIG. 15 illustrates an example computer system in accordance with example embodiments of the inventive concept. As shown, the computer system 3000 may include one or more power supplies 3002, one or more monitors 3004 (for example, a conventional and/or touch-screen monitor), one or more input devices 3006, for example, a mouse, a keyboard, and/or a stylus, a main or motherboard 3008, to which one or more components 3010 are attached. The one or more sub-components 3010 may be one or more central processing units (CPUs), one or more memories, and/or one or more cards. The computer system 3000 may include one or more additional memories 3012, which may be removable or more easily removable.

In example embodiments of the inventive concept, the computer system 3000 may be desktop, personal computer, a laptop personal computer, and/or a handheld personal computer. In example embodiments of the inventive concept, the computer system 3000 may be a server.

Example embodiments of the inventive concept of solid state device systems, as discussed above may be implemented as components or sub-components in one or more computer system 3000, as described above.

In example embodiments of the inventive concept, the solid state systems disclosed herein may be or include SSDs, for example, electronics with no moving parts, hence, less fragile than hard disks, having no mechanical delays, and/or lower access times and/or latency than electromechanical devices.

In example embodiments of the inventive concept, the solid state systems disclosed herein may include or be components of flash memories, for example, NAND or NOR flash memories. In example embodiments of the inventive concept, the solid state systems disclosed herein may include or be components of Multi-level cell (MLC) flash memory or Single-level cell (SLC) flash memory.

In example embodiments of the inventive concept, the solid state systems disclosed herein may include or be components of DRAM memories.

In example embodiments of the inventive concept, the solid state systems may be of various form factors. In example embodiments of the inventive concept, the form factor may be the 1.8 inch or 2.5 inch SATA-2 standard structures. In example embodiments of the inventive concept, the form factor may be the 3.5-inch SATA-2 standard structure or another structure, for example, a CompactFlash Type (for example, Type I or II), SD memory card, miniSD, microSD, TransFlash, MultiMediaCard (MMC), MMCplus, RS-MMC, DV RS-MMC, MMCmobile, MMCmicro, Memory Stick, Memory Stick PRO, Memory Stick Duo, Memory Stick PRO Duo, SmartMedia Card, xD-Picture Card, PC Card (for example, Types I, II, or III), and/or USB Flash Drive Example embodiments of the inventive concept being thus described, it will be obvious that the same may be varied in many ways. Such variations are not to be regarded as a departure from example embodiments of the inventive concept, and all such modifications are intended to be included within the scope of append claims.

What is claimed:

1. A solid state drive system, comprising:
   at least one semiconductor memory;
   a control circuit including first connection terminals, configured to supply one or more operational voltages to the at least one semiconductor memory;
   second connection terminals configured to supply one or more test voltages to the at least one semiconductor memory; and
   a switch, operationally connected to the second connection terminals to supply the one or more test voltages to the at least one semiconductor memory, wherein the at least one semiconductor memory is configured to store test firmware and operational data; the solid state drive system further comprising:
   at least one auxiliary semiconductor memory configured to store the test firmware but not operational data.

2. The solid state drive system of claim 1, wherein the one or more test voltages do not pass through a voltage regulator.

3. The solid state drive system of claim 1, wherein the one or more test voltages are larger than the one or more operational voltages.

4. The solid state drive system of claim 1, wherein the one or more test voltages are supplied from the second connection terminals to the at least one semiconductor memory without a voltage drop.

5. The solid state drive system of claim 1, wherein the one or more test voltages are used to activate a multi-block test function of the at least one semiconductor memory.

6. The solid state drive system of claim 1, wherein the one or more test voltages are boosted by a boosting function of the at least one semiconductor memory.

7. The solid state drive system of claim 1, the control circuit further including
   at least one voltage regulator, configured to regulate the one or more operational voltages and supply the regulated voltage to the at least one semiconductor memory.

8. The solid state drive system of claim 1, wherein the switch includes a plurality of transistors, one for each of the at least one semiconductor memory.

9. The solid state drive system of claim 1, wherein the at least one controller acts as the switch.

10. The solid state drive system of claim 1, wherein the switch provides a different test voltage to each of the at least one solid state memories.

11. The solid state drive system of claim 1, wherein the at least one auxiliary semiconductor memory is different from the at least one semiconductor memory.

12. The solid state drive system of claim 1, wherein the at least one auxiliary semiconductor memory is one of a PRAM, MRAM, FRAM, and RRAM.

13. The solid state drive system of claim 1, wherein the at least one semiconductor memory is a one of a PRAM, MRAM, FRAM, and RRAM.

14. A solid state drive system, comprising:
   at least one semiconductor memory, configured to store test firmware and operational data;
   at least one auxiliary semiconductor memory configured to store the test firmware but not operational data; and
   a switch, operationally connected to the second connection terminals to supply the one or more test voltages to the at least one semiconductor memory.

15. The solid state drive system of claim 14, wherein the at least one auxiliary semiconductor memory is different from the at least one semiconductor memory.

16. The solid state drive system of claim 14, wherein the at least one auxiliary semiconductor memory is a one of a PRAM, MRAM, FRAM, and RRAM.

17. The solid state drive system of claim 14, wherein the at least one semiconductor memory is a one of a PRAM, MRAM, FRAM, and RRAM.

18. The solid state drive system of claim 14, wherein the at least one auxiliary semiconductor memory is an SRAM embedded in at least one controller.

19. A method of reducing test time in a solid state drive system, comprising:
   supplying one or more operational voltages to at least one semiconductor memory via first connection terminals; and
   supplying one or more test voltages to the at least one semiconductor memory via second connection terminals and a switch, further comprising:

storing test firmware and operational data in the at least one semiconductor memory; and storing test firmware but not operational data in at least one auxiliary semiconductor memory.

20. A method of reducing test time in a solid state drive system, comprising:

supplying one or more test voltages to at least one semiconductor memory via a switch;

storing test firmware and operational data in the at least one semiconductor memory; and storing the test firmware but not operational data in at least one auxiliary semiconductor memory.

21. The method of claim 20, wherein the at least one auxiliary semiconductor memory is different from the at least one semiconductor memory.

22. The method of claim 20, wherein the at least one auxiliary semiconductor memory is a one of a PRAM, MRAM, FRAM, and RRAM.

23. The method of claim 20, wherein the at least one semiconductor memory is a one of a PRAM, MRAM, FRAM, and RRAM.

24. The method of claim 20, wherein the at least one auxiliary semiconductor memory is an SRAM embedded in at least one controller.

* * * * *